(12) United States Patent
Choi et al.

(10) Patent No.: US 12,127,450 B2
(45) Date of Patent: Oct. 22, 2024

(54) DISPLAY APPARATUS HAVING REDUCED DEFECTS

(71) Applicant: Samsung Display Co., Ltd., Yongin-Si (KR)

(72) Inventors: Yoonsun Choi, Yongin-si (KR); Hyunchul Kim, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 706 days.

(21) Appl. No.: 17/335,021

(22) Filed: May 31, 2021

(65) Prior Publication Data

US 2021/0288132 A1     Sep. 16, 2021

Related U.S. Application Data

(63) Continuation of application No. 16/830,182, filed on Mar. 25, 2020, now Pat. No. 11,038,008, which is a
(Continued)

(30) Foreign Application Priority Data

Aug. 18, 2016   (KR) .................... 10-2016-0104990

(51) Int. Cl.
*H10K 59/131*   (2023.01)
*H10K 50/844*   (2023.01)
(Continued)

(52) U.S. Cl.
CPC ......... *H10K 59/131* (2023.02); *H10K 50/844* (2023.02); *H10K 77/111* (2023.02);
(Continued)

(58) Field of Classification Search
CPC .. H10K 50/80; H10K 50/844; H10K 50/8445; H10K 59/124; H10K 59/131;
(Continued)

(56) References Cited

U.S. PATENT DOCUMENTS

| 5,131,976 A | 7/1992 | Hoko |
| 8,115,206 B2 | 2/2012 | Sakakura et al. |

(Continued)

FOREIGN PATENT DOCUMENTS

| CN | 104269417 A | 1/2015 |
| CN | 104425550 A | 3/2015 |

(Continued)

OTHER PUBLICATIONS

European Search Report, Application No. 17186417.6, Jan. 11, 2018, pp. 1-11.
(Continued)

*Primary Examiner* — Brook Kebede
(74) *Attorney, Agent, or Firm* — Innovation Counsel LLP

(57) ABSTRACT

Provided is a display apparatus capable of reducing generation of defects during manufacturing of the display apparatus or while in use after being manufactured. The display apparatus includes a substrate including a bending area between a first area and a second area, the substrate being bent in the bending area about a bending axis; an inorganic insulating layer over the substrate and including a first feature that is either a first opening or a first groove, the first feature positioned to correspond to the bending area; and an organic material layer at least partially filling the first feature, and including a second feature that is a second opening or a second groove, the second feature extending along an edge of the substrate.

82 Claims, 14 Drawing Sheets

Related U.S. Application Data continuation of application No. 16/505,638, filed on Jul. 8, 2019, now Pat. No. 10,629,670, which is a continuation of application No. 16/167,211, filed on Oct. 22, 2018, now Pat. No. 10,388,715, which is a continuation of application No. 15/617,895, filed on Jun. 8, 2017, now Pat. No. 10,134,827.

(51) Int. Cl.
*H10K 77/10* (2023.01)
*H10K 50/842* (2023.01)
*H10K 102/00* (2023.01)

(52) U.S. Cl.
CPC .... *H10K 50/8426* (2023.02); *H10K 2102/311* (2023.02); *Y02E 10/549* (2013.01)

(58) Field of Classification Search
CPC ...... H10K 59/40; H10K 71/00; H10K 77/111; H10K 2102/311
See application file for complete search history.

(56) References Cited

U.S. PATENT DOCUMENTS

| | | | |
|---|---|---|---|
| 8,791,455 | B2 | 7/2014 | Kim et al. |
| 9,287,329 | B1 | 3/2016 | Lee et al. |
| 9,472,507 | B2 | 10/2016 | Kwak |
| 9,876,064 | B2 | 1/2018 | Kim et al. |
| 10,134,827 | B2 | 11/2018 | Choi et al. |
| 2010/0285627 | A1 | 11/2010 | Tateishi et al. |
| 2014/0306941 | A1 | 10/2014 | Kim et al. |
| 2014/0353670 | A1 | 12/2014 | Youn et al. |
| 2015/0280170 | A1 | 10/2015 | Harikrishna Mohan et al. |
| 2015/0382446 | A1 | 12/2015 | Kwon et al. |
| 2016/0170249 | A1 | 6/2016 | Lee |
| 2016/0190216 | A1 | 6/2016 | Yang et al. |
| 2016/0190522 | A1 | 6/2016 | Lee et al. |
| 2016/0211313 | A1 | 7/2016 | Kim et al. |
| 2016/0218305 | A1 | 7/2016 | Kim et al. |
| 2016/0276626 | A1 | 9/2016 | Andou |
| 2016/0322601 | A1 | 11/2016 | Lee |

FOREIGN PATENT DOCUMENTS

| | | | | |
|---|---|---|---|---|
| CN | 104952904 | A | 9/2015 | |
| CN | 105826350 | A | 8/2016 | |
| EP | 1584971 | A1 | 10/2005 | |
| EP | 1921678 | A1 * | 5/2008 | ......... H01L 27/3272 |
| EP | 2814074 | A1 | 12/2014 | |
| JP | 2007-053355 | A | 3/2007 | |
| JP | 2014-232300 | A | 12/2014 | |
| JP | 2014-232568 | A | 12/2014 | |
| JP | 2015-002177 | A | 1/2015 | |
| KR | 10-2002-0049941 | A | 6/2002 | |
| KR | 10-2005-0062797 | A | 6/2005 | |
| KR | 10-2014-0045193 | A | 4/2014 | |
| KR | 10-2014-0140150 | A | 12/2014 | |
| KR | 10-2015-0069308 | A | 6/2015 | |
| KR | 10-2016-0088534 | A | 7/2016 | |
| KR | 10-2016-0093202 | A | 8/2016 | |

OTHER PUBLICATIONS

Chinese Communication corresponding to Chinese Patent Application No. 201710697080.4 dated Jan. 6, 2021 7 pages.

* cited by examiner

DISPLAY APPARATUS HAVING REDUCED DEFECTS

CROSS-REFERENCE TO RELATED APPLICATION(S)

This application is a continuation application of U.S. patent application Ser. No. 16/830,182 filed on Mar. 25, 2020, which is a continuation application of U.S. patent application Ser. No. 16/505,638 filed on Jul. 8, 2019 (Now U.S. Pat. No. 10,629,670), which is a continuation application of U.S. patent application Ser. No. 16/167,211 filed on Oct. 22, 2018 (Now U.S. Pat. No. 10,388,715), which is a continuation application of U.S. patent application Ser. No. 15/617,895 filed on Jun. 8, 2017 (Now U.S. Pat. No. 10,134,827), which claims priority to and the benefit of Korean Patent Application No. 10-2016-0104990 filed on Aug. 18, 2016 in the Korean Intellectual Property Office, the disclosure of which is incorporated herein in its entirety by reference.

BACKGROUND

1. Field

One or more embodiments relate to a display apparatus, and more particularly, to a display apparatus capable of reducing occurrence of defects during manufacture or in subsequent use.

2. Description of the Related Art

In general, a display apparatus includes a display unit above a substrate. When such a display apparatus is at least partially bent, visibility at various angles may be improved or the size of a non-display area may be reduced.

However, in a display apparatus according to the prior art, defects may occur at a bending portion or nearby, during manufacture or later use.

SUMMARY

One or more embodiments include a display apparatus capable of reducing occurrence of defects during manufacturing of the display apparatus or while in use after being manufactured.

Additional aspects will be set forth in part in the description which follows and, in part, will be apparent from the description, or may be learned by practice of the presented or other embodiments.

According to one or more embodiments, a display apparatus includes: a substrate including a bending area between a first area and a second area, the substrate being bent in the bending area about a bending axis; an inorganic insulating layer over the substrate and including a first feature that is a first opening or a first groove, the first feature positioned to correspond to the bending area; and an organic material layer at least partially filling the first feature, and including a second feature that is a second opening or a second groove, the second feature extending along an edge of the substrate.

At least one of the first opening and the second groove may overlap the bending area. An area of the first opening or the first groove may be greater than an area of the bending area. A length of the second opening or the second groove may be greater than a width of the bending area in a direction from the first area to the second area.

The display apparatus may further include a first conductive layer over the organic material layer, the first conductive layer extending from the first area to the second area across the bending area.

A width of one of the first opening and the first groove may be greater than a length of one of the second opening and the second groove. The display apparatus may further include an additional organic material layer covering the first conductive layer and the organic material layer, wherein the additional organic material layer may include a third feature that is a third opening or a third groove, the third feature extending along the edge of the substrate so as to correspond to the second opening or the second groove.

A length of one of the second opening and the second groove may be greater than a length of one of the third opening and the third groove.

The additional organic material layer may cover a side of the second opening or the second groove. The display apparatus may further include a conductive remaining layer over at least a part of a side of the second opening or the second groove, wherein the additional organic material layer may cover the conductive remaining layer. The conductive remaining layer may include a same material as the first conductive layer.

The display apparatus may further include a second conductive layer in the first area or the second area so as to be located on a layer different from a layer on which the first conductive layer is located, the second conductive layer being electrically connected to the first conductive layer. An elongation rate of the first conductive layer may be greater than an elongation rate of the second conductive layer.

The organic material layer may include an additional opening or an additional groove extending along an edge of the substrate to be adjacent to the second opening or the second groove. A length of the additional opening or the additional groove may be less than a length of the second opening or the second groove, and the additional opening or the additional groove may cross a virtual line extending parallel with the bending axis and crossing a center of the bending area.

The second opening or the second groove may have a first width at a first portion proximate to a center of the bending area and a second width remote from the first portion, the first width being greater than the second width.

The organic material layer may further include an auxiliary opening or an auxiliary groove connected to the second opening or the second groove and extending in a direction crossing a direction in which the second opening or the second groove extends.

The display apparatus may further include a bending protection layer filling the second opening or the second groove. The bending protection layer may cover the bending area.

According to one or more embodiments, a display apparatus includes: a substrate including a bending area between a first area and a second area, the substrate being bent in the bending area about a bending axis; a first conductive layer extending from the first area to the second area across the bending area; and an insulating layer between the substrate and the first conductive layer and including an opening or a groove, the opening or groove extending in a direction crossing the bending axis so as to correspond to a portion between an edge of the substrate and the first conductive layer in the bending area.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
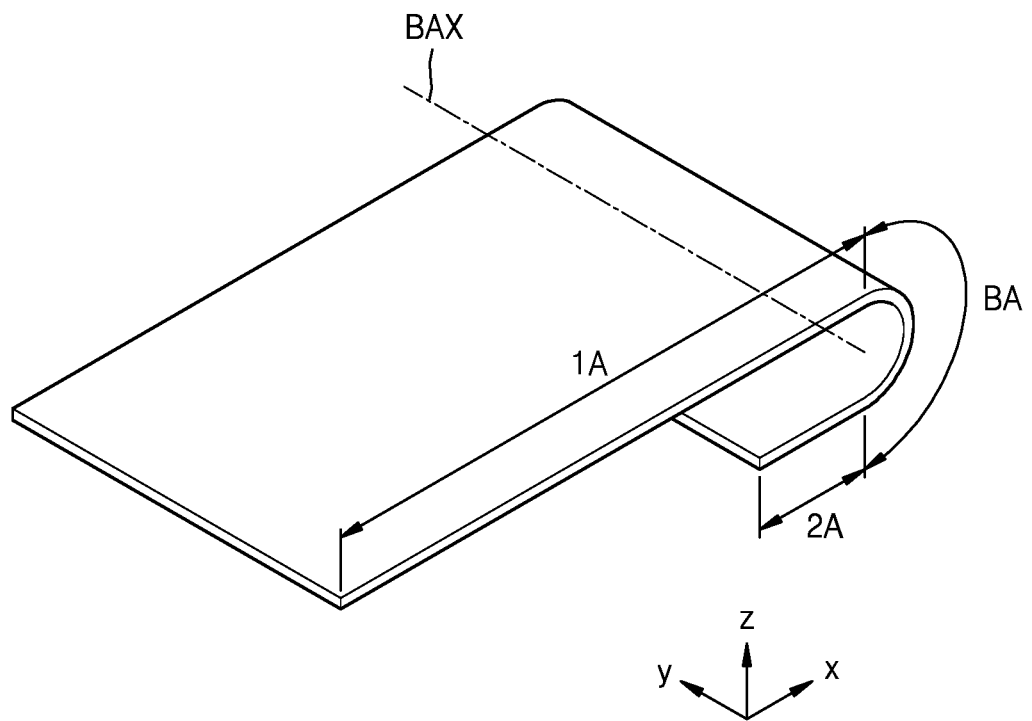
FIG. 1 is a schematic perspective view of a part of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. All numerical values are approximate, and may vary. All examples of specific materials and compositions are to be taken as nonlimiting and exemplary only. Other suitable materials and compositions may be used instead.

Hereinafter, the present disclosure will be described in detail by explaining preferred embodiments of the inventive concept with reference to the attached drawings. Like reference numerals in the drawings denote like elements.

Sizes of components in the drawings may be exaggerated for convenience of explanation. In other words, since sizes and thicknesses of components in the drawings are arbitrarily illustrated for convenience of explanation, the following embodiments are not limited thereto, and the drawings are not necessarily to scale.

In the following examples, an x-axis, a y-axis and a z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
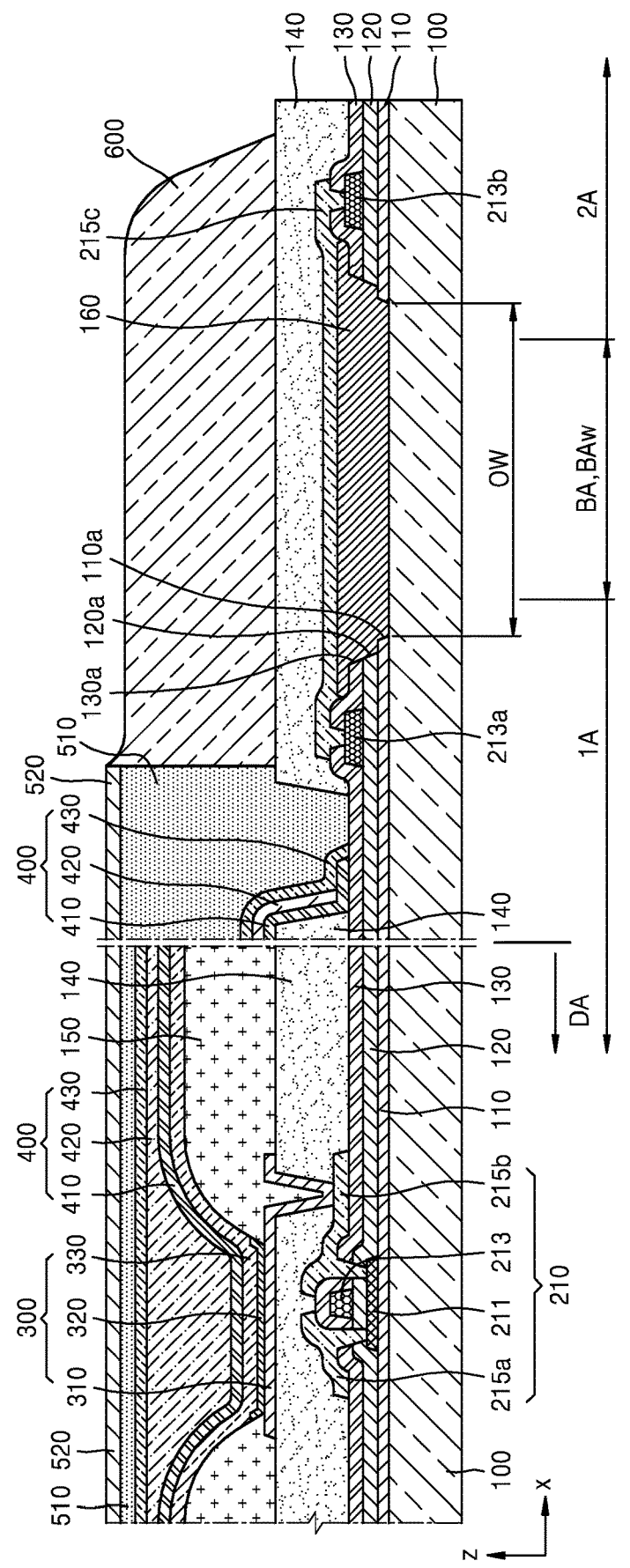
FIG. 2 is a schematic cross-sectional view of a part of the display apparatus of FIG. 1.
Figure 3:
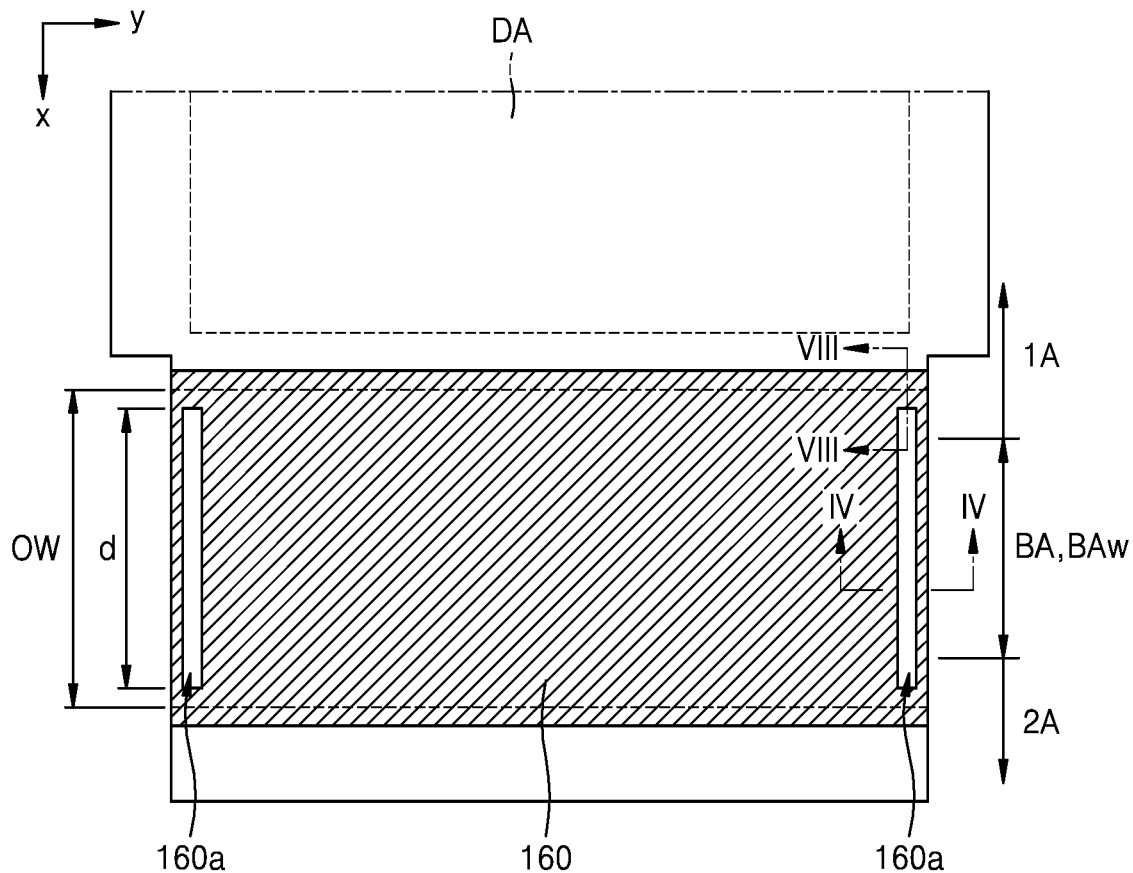
FIG. 3 is a schematic plan view of a part of the display apparatus of FIG. 1.

FIG. 1 is a schematic perspective view of a display apparatus according to an embodiment, FIG. 2 is a schematic cross-sectional view of a part of the display apparatus of FIG. 1, and FIG. 3 is a schematic plan view of a part of the display apparatus of FIG. 1.

As shown in FIGS. 1 to 3, a substrate 100 in the display apparatus according to the embodiment includes a bending area BA extending in a first direction (+y direction). The bending area BA is between a first area 1A and a second area 2A in a second direction (+x direction) crossing the first direction. In addition, the substrate 100 is bent about a bending axis BAX extending in the first direction (+y direction) as shown in FIG. 1. The substrate 100 may include various materials having flexible or bendable characteristics, e.g., polymer resins such as polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), and cellulose acetate propionate (CAP). The substrate 100 may have a multi-layered structure including two layers having one or more of the above polymer resins, as well as a barrier layer including an inorganic material such as silicon oxide, silicon nitride, and silicon oxynitride between the two layers.

In FIG. 1, the substrate 100 has a constant width in a y-axis direction throughout the first area 1A, the bending area BA, and the second area 2A, but is not limited thereto. For example, as shown in FIG. 3, the substrate 100 may have a width varying in the y-axis direction within the first area 1A. In this case, a narrower width of the substrate 100 within the first area 1A may be equal to the width of the substrate within the bending area BA or in the second area 2A, as shown in FIG. 3.

The first area 1A includes a display area DA. The first area 1A may further include a part of a non-display area outside the display area DA, in addition to the display area DA, as shown in FIG. 2. The second area 2A may also include the non-display area.

In the display area DA of the substrate 100, a thin film transistor (TFT) 210 electrically connected to a display device 300 may be located in addition to the display device 300, as shown in FIG. 2. In FIG. 2, an organic light-emitting device is located in the display area DA as the display device 300. Electric connection of the organic light-emitting device to the TFT 210 may be understood as a pixel electrode 310 being electrically connected to the TFT 210.

The TFT 210 may include a semiconductor layer 211 including amorphous silicon, polycrystalline silicon, or an organic semiconductor material. The TFT 210 may also include a gate electrode 213, a source electrode 215a, and a drain electrode 215b. In order to ensure insulation between the semiconductor layer 211 and the gate electrode 213, a gate insulating layer 120 may be formed between the semiconductor layer 211 and the gate electrode 213, wherein the gate insulating layer 120 includes an inorganic material such as silicon oxide, silicon nitride, and/or silicon oxynitride. In addition, an interlayer insulating layer 130 may be on the gate electrode 213, and the source electrode 215a and the drain electrode 215b may be on the interlayer insulating layer 130, wherein the interlayer insulating layer 130 includes an inorganic material such as silicon oxide, silicon nitride, and/or silicon oxynitride. The insulating layers including the inorganic material may be formed by chemical vapor deposition (CVD) or atomic layer deposition (ALD). This will be applied to other embodiments and modifications thereof that will be described later.

A buffer layer 110 may be between the TFT 210 having the above structure and the substrate 100. The buffer layer 110 may include an inorganic material such as silicon oxide, silicon nitride, and/or silicon oxynitride. The buffer layer 110 may improve smoothness of the upper surface of the substrate 100, or prevent or reduce infiltration of impurities from the substrate 100 into the semiconductor layer 211 of the TFT 210.

A planarization layer 140 may be arranged on the TFT 210. For example, as shown in FIG. 2, when the organic light-emitting device is on the TFT 210, the planarization layer 140 may planarize an upper portion of the TFT 210. The planarization layer 140 may include, for example, an organic material such as acryl, benzocyclobutene (BCB), and hexamethyldisiloxane (HMDSO). In FIG. 2, although the planarization layer 140 has a single-layered structure, the planarization layer 140 may be variously modified. For example, the planarization layer 140 may have a multi-layered structure. In addition, as shown in FIG. 2, the planarization layer 140 may have an opening outside the display area DA, so that a part of the planarization layer 140 in the display area DA and a part of the planarization layer 140 in the second area 2A may be physically separate from each other. Thus, impurities from outside may not reach the display area DA via the planarization layer 140.

In the display area DA of the substrate 100, the display device 300 may be on the planarization layer 140. The display device 300 may be an organic light-emitting device including the pixel electrode 310, an opposite electrode 330, and an intermediate layer 320 between the pixel electrode 310 and the opposite electrode 330 and including an emission layer. The pixel electrode 310 may contact one of the source electrode 215a and the drain electrode 215b via an opening formed in the planarization layer 140 and may be electrically connected to the TFT 210, as shown in FIG. 2.

A pixel defining layer 150 may be on the planarization layer 140. The pixel defining layer 150 includes openings corresponding respectively to sub-pixels, that is, at least an opening exposing a center portion of the pixel electrode 310, to define pixels. Also, in the example shown in FIG. 2, the pixel defining layer 150 increases a distance between an edge of the pixel electrode 310 and the opposite electrode 330 above the pixel electrode 310 so as to prevent an arc from being generated at the edge of the pixel electrode 310. The pixel defining layer 150 may include an organic material, for example, PI or HMDSO.

The intermediate layer 320 of the organic light-emitting device may include low-molecular weight organic materials or polymer materials. When the intermediate layer 320 includes a low-molecular weight organic material, the emission layer may include a hole injection layer (HIL), a hole transport layer (HTL), an emission layer (EML), an electron transport layer (ETL), and an electron injection layer (EIL) in a single or multiple-layered structure, and examples of organic materials may include copper phthalocyanine (CuPc), N,N'-Di(naphthalene-1-yl)-N, N'-diphenyl-benzidine (NPB), and tris-8-hydroxyquinoline aluminum (Alq$_3$). The low-molecular weight organic materials may be deposited by a vacuum deposition method.

When the intermediate layer 320 includes a polymer material, the intermediate layer 320 may include an HTL and an EML. Here, the HTL may include poly(3,4-ethylenedioxythiophene (PEDOT), and the EML may include a polyphenylenevinylene (PPV)-based or polyfluorene-based polymer material. The intermediate layer 320 above may be formed by a screen printing method, an inkjet printing method, or a laser induced thermal imaging (LITI) method.

However, the intermediate layer 320 is not limited to the above example, and may have various structures. In addition, the intermediate layer 320 may include a layer that is integrally formed across a plurality of pixel electrodes 310, or a layer that is patterned to correspond to each of the plurality of pixel electrodes 310.

The opposite electrode 330 is arranged above the display area DA, and as shown in FIG. 2, may cover the display area DA. That is, the opposite electrode 330 may be integrally formed with respect to a plurality of organic light-emitting devices, so as to correspond to a plurality of pixel electrodes 310.

Since the organic light-emitting device may be easily damaged by external moisture or oxygen, an encapsulation layer 400 may cover the organic light-emitting device to protect the organic light-emitting device. The encapsulation layer 400 covers the display area DA, and may also extend outside the display area DA. The encapsulation layer 400 may include a first inorganic encapsulation layer 410, an organic encapsulation layer 420, and a second inorganic encapsulation layer 430, as shown in FIG. 2.

The first inorganic encapsulation layer 410 covers the opposite electrode 330, and may include silicon oxide, silicon nitride, and/or silicon oxynitride. If desired, other layers such as a capping layer may be arranged between the first inorganic encapsulation layer 410 and the opposite electrode 330. Since the first inorganic encapsulation layer 410 is shaped according to its underlying structures, the first inorganic encapsulation layer 410 may have an uneven upper surface. The organic encapsulation layer 420 covers the first inorganic encapsulation layer 410, and unlike the first inorganic encapsulation layer 410, the organic encapsulation layer 420 may have an even or substantially flat upper surface. In more detail, the organic encapsulation layer 420 may substantially have an even upper surface at a portion corresponding to the display area DA. The organic encapsulation layer 420 may include at least one material selected from PET, PEN, PC, PI, polyethylene sulfonate, polyoxymethylene, polyarylate, and hexamethyldisiloxane. The second inorganic encapsulation layer 430 covers the organic encapsulation layer 420, and may include silicon oxide, silicon nitride, and/or silicon oxynitride. The second inorganic encapsulation layer 430 may contact the first inorganic encapsulation layer 410 at an edge thereof outside the display area DA, in order not to expose the organic encapsulation layer 420 to the outside.

As described above, since the encapsulation layer 400 includes the first inorganic encapsulation layer 410, the organic encapsulation layer 420, and the second inorganic encapsulation layer 430, even if there is a crack in the encapsulation layer 400 in the above multi-layered structure, the crack may be disconnected between the first inorganic encapsulation layer 410 and the organic encapsulation layer 420 or between the organic encapsulation layer 420 and the second inorganic encapsulation layer 430. As such, the likelihood of forming a path through which external moisture or oxygen may infiltrate into the display area DA may be reduced.

A polarization plate 520 may be attached on the encapsulation layer 400 via an optically clear adhesive (OCA) 510. The polarization layer 520 may reduce reflection of external light. For example, when external light that passes through the polarization plate 520 is reflected by an upper surface of the opposite electrode 330 and then passes through the polarization plate 520 again, the external light passes through the polarization plate 520 twice and a phase of the external light may be changed. Therefore, a phase of reflected light is different from the phase of the external light entering the polarization plate 520 and thus destructive interference occurs. Accordingly, reflection of external light may be reduced and visibility may be improved. The OCA 510 and the polarization plate 520 may cover an opening in the planarization layer 140, as shown in FIG. 2. The display apparatus according to one or more embodiments may not necessarily include the polarization plate 520, and if desired, the polarization plate 520 may be omitted or replaced by other elements. For example, the polarization plate 520 may be omitted, and a black matrix and a color filter may be used to reduce reflection of external light.

In addition, the buffer layer 110, the gate insulating layer 120, and the interlayer insulating layer 130 including the inorganic material may be collectively referred to as an inorganic insulating layer. The inorganic insulating layer may include a first feature that is a first opening corresponding to the bending area BA, as shown in FIG. 2. That is, the buffer layer 110, the gate insulating layer 120, and the interlayer insulating layer 130 may respectively include openings 110a, 120a, and 130a corresponding to the bending area BA. That the first opening corresponds to the bending area BA may denote that the opening overlaps the bending area BA. Here, an area of the first opening may be greater than that of the bending area BA. To do this, in FIG. 2, a width OW of the first opening is greater than a width BAw of the bending area BA. Here, the area of the first opening may be defined as the smallest area among areas of the openings 110a, 120a, and 130a, of the buffer layer 11, the gate insulating layer 120, and the interlayer insulating layer 130. In FIG. 2, the area of the first opening is defined by an area of the opening 110a in the buffer layer 110.

After forming the opening 130a in the buffer layer 130, the opening 120a of the gate insulating layer 120 and the opening 130a of the interlayer insulating layer 130 may be simultaneously formed. When the TFT 210 is formed, in order for the source electrode 215a and the drain electrode 215b to contact the semiconductor layer 211, contact holes penetrating through the gate insulating layer 120 and the interlayer insulating layer 130 have to be formed. Thus, the opening 120a of the gate insulating layer 120 and the opening 130a of the interlayer insulating layer 130 may be simultaneously formed when forming the contact holes. Accordingly, an internal surface of the opening 120a of the gate insulating layer 120 and an internal surface of the opening 130a of the interlayer insulating layer 130 may form a single continuous surface as shown in FIG. 2.

The display apparatus according to the embodiment includes an organic material layer 160 at least partially filling the first opening of the inorganic insulating layer. In FIG. 2, the organic material layer 160 completely fills the first opening. In addition, the display apparatus according to the embodiment includes a first conductive layer 215c, and the first conductive layer 215c extends from the first area 1A to the second area 2A across the bending area BA and above the organic material layer 160. The first conductive layer 215c may also extend over an inorganic insulating layer such as the interlayer insulating layer 130, where the organic material layer 160 is not provided. The first conductive layer 215c may be formed simultaneously with the source electrode 215a or the drain electrode 215b by using the same material as that of the source electrode 215a or the drain electrode 215b.

As described above, although FIG. 2 shows a state in which the display apparatus is not bent for convenience of description, the display apparatus according to the embodiment is actually in a state in which the substrate 100 is bent at the bending area BA, as shown in FIG. 1. To do this, the display apparatus is manufactured so that the substrate 100 is flat, as shown in FIG. 2, and after that, the substrate 100 is bent at the bending area BA so that the display apparatus may have the shape as shown in FIG. 1. Here, when the substrate 100 is bent at the bending area BA, tensile stress may be induced in the first conductive layer 215c. However, in the display apparatus according to the embodiment, the occurrence of defects in the first conductive layer 215c during the bending process may be prevented or reduced.

If the inorganic insulating layers such as the buffer layer 110, the gate insulating layer 120, and/or the interlayer insulating layer 130 do not include openings corresponding to the bending area BA, but continuously extend from the first area 1A to the second area 2A, and if the first conductive layer 215c is on such an inorganic insulating layer, large tensile stress is applied to the first conductive layer 215c during bending of the substrate 100. In particular, since the inorganic insulating layer has a greater hardness than that of the organic material layer, cracks are likely to form in the inorganic insulating layer in the bending area BA, and when a crack occurs in the inorganic insulating layer, a crack may also occur in the first conductive layer 215c on the inorganic insulating layer and thus the probability of generating defects such as disconnections in the first conductive layer 215c increases greatly.

However, according to the display apparatus of the embodiment, the inorganic insulating layer includes the first opening corresponding to the bending area BA, and the part of the first conductive layer 215c which corresponds to the bending area BA is on the organic material layer 160 that at least partially fills the first opening. Since the inorganic insulating layer includes the first opening corresponding to the bending area BA, the possibility of cracks occurring in the inorganic insulating layer is greatly decreased, and the organic material layer 160 is less likely to have cracks due to characteristics of the organic material. Therefore, the occurrence of cracks in the portion of the first conductive layer 215c on the organic material layer 160 may be prevented or reduced, wherein the portion of the first conductive layer 215c corresponds to the bending area BA. Since the organic material layer 160 has a lower hardness than that of an inorganic material layer, the organic material layer 160 may absorb the tensile stress generated due to the bending of the substrate 100 so as to reduce concentration of the tensile stress in the first conductive layer 215c.

In FIG. 2, the inorganic insulating layer has the first opening, but is not limited thereto. For example, the inorganic insulating layer may have a first feature that is a first groove, rather than the first opening. For example, the buffer layer 110 may not include the opening 110a unlike the example shown in FIG. 2, but may extend in continuous manner from the first area 1A to the second area 2A across the bending area BA. Then, the gate insulating layer 120 and the interlayer insulating layer 130 may only include the openings 120a and 130a. In this case, the buffer layer 110, the gate insulating layer 120, and the interlayer insulating layer 130, which include the inorganic material, may be collectively referred to as an inorganic insulating layer, and in this case, the inorganic insulating layer may be understood to have the first groove corresponding to the bending area BA. In addition, the organic material layer 160 may at least partially fill the first groove.

In the above case, since the inorganic insulating layer has the first groove corresponding to the bending area BA, a thickness of the inorganic insulating layer is reduced in the bending area BA, and accordingly, the substrate 100 may be more easily bent. In addition, since the organic material layer 160 is in the bending area BA and the first conductive layer 215c is above the organic material layer 160, damage to the first conductive layer 215c during the bending operation may be effectively prevented. An example in which the inorganic insulating layer includes the first opening is described in the above embodiments and other embodiments that will be described later, or modified examples thereof for convenience of description, but the inorganic insulating layer may instead include the first groove as described above.

The display apparatus according to the embodiment may include second conductive layers 213a and 213b, in addition to the first conductive layer 215c. The second conductive layers 213a and 213b are located above the first area 1A or the second area 2A to be located at a different layer from that of the first conductive layer 215c, and may be electrically connected to the first conductive layer 215c. In FIG. 2, the second conductive layers 213a and 213b are at the same layer, that is, on the gate insulating layer 120, and use the same material as that of the gate electrode 213. In addition, the first conductive layer 215c contacts the second conductive layers 213a and 213b via contact holes in the interlayer insulating layer 130. In addition, the second conductive layer 213a is in the first area 1A, and the second conductive layer 213b is in the second area 2A.

The second conductive layer 213a in the first area 1A may be electrically connected to the TFT 210 in the display area DA, and accordingly, the first conductive layer 215c may be electrically connected to the TFT 210 in the display area DA via the second conductive layer 213a. The second conductive layer 213b in the second area 2A may also be electrically connected to the TFT 210 of the display area DA, via the first conductive layer 215c. As such, the second conductive layers 213a and 213b that are outside the display area DA may be electrically connected to the elements in the display area DA, or may extend toward the display area DA so that at least some parts of the second conductive layers 213a and 213b may be located in the display area DA.

As described above, although FIG. 2 shows a state in which the display apparatus is not bent for convenience of description, the display apparatus according to the embodiment is actually in a state in which the substrate 100 is bent at the bending area BA, as shown in FIG. 1. To do this, the display apparatus is manufactured so that the substrate 100 is flat, as shown in FIG. 2, and after that, the substrate 100 is bent at the bending area BA so that the display apparatus may have the shape as shown in FIG. 1. Here, while the substrate 100 is bent at the bending area BA, tensile stress may be applied to the elements in the bending area BA.

Therefore, the first conductive layer 215c crossing over the bending area BA includes a material having high elongation rate, so that defects such as cracks in the first conductive layer 215c or disconnection of the first conductive layer 215c may be prevented. In addition, the second conductive layers 213a and 213b, including a material having an elongation rate lower than that of the first conductive layer 215c and electrical/physical characteristics different from those of the first conductive layer 215c, are formed in the first area 1A or the second area 2A, and thus, an efficiency of transferring electric signals in the display apparatus may be improved or a defect rate during the manufacturing processes of the display apparatus may be reduced.

For example, the second conductive layers 213a and 213b may include molybdenum, and the first conductive layer 215c may include aluminum. The first conductive layer 215c and the second conductive layers 213a and 213b may have multi-layered structures, if desired. For example, the first conductive layer 215c may have a multi-layered structure such as a titanium layer/aluminum layer/titanium layer structure, and the second conductive layers 213a and 213b may each have a multi-layered structure such as a molybdenum layer/titanium layer structure. However, one or more embodiments are not limited thereto, that is, the first conductive layer 215c may extend to the display area to be electrically connected directly to the source electrode 215a, the drain electrode 215b, or the gate electrode 213 of the TFT 210.

In addition, as shown in FIG. 2, the organic material layer 160 may cover an internal surface of the first opening of the inorganic insulating layer. As described above, since the first conductive layer 215c may include the same material as, and may be formed simultaneously with, the source electrode 215a and the drain electrode 215b, a conductive layer may be formed on the interlayer insulating layer 130 over an entire surface of the substrate 100 and may be patterned to form the source electrode 215a, the drain electrode 215b, and the first conductive layer 215c. If the organic material layer 160 does not cover the inner side surfaces of the opening 110a in the buffer layer 110, the opening 120a in the gate insulating layer 120, or the opening 130a in the interlayer insulating layer 130, the conductive material of the conductive layer may not be removed from, but may remain on, these inner side surfaces. In this case, the remaining conductive material may cause shorts between different conductive layers.

Therefore, when the organic material layer 160 is formed, the organic material layer 160 may cover the inner side surface of the first opening in the inorganic insulating layer. If the organic material layer 160 includes a second feature that is a second opening 160a that will be described later, in order to make the organic material layer 160 cover the internal surface of the first opening in the inorganic insulating layer, a width OW of the inorganic insulating layer in a direction from the first area 1A towards the second area 2A may be greater than a length d of the second opening 160a of the organic material layer 160 in a direction in which the second opening 160a extends.

In FIG. 2, the organic material layer 160 is shown to have a largely constant thickness, but the organic material layer 160 may have a thickness that varies depending on locations therein, so that an upper surface of the organic material layer 160 may have a gradual curve near edges of the opening 110a in the buffer layer 110, the opening 120a in the gate insulating layer 120, and the opening 130a in the interlayer insulating layer 130. Accordingly, remaining conductive material that should have been removed may be prevented during patterning the conductive layer in order to form the source electrode 215a, the drain electrode 215b, and the first conductive layer 215c.

In addition, a bending protection layer (BPL) 600 may be located outside the display area DA. That is, the BPL 600 may be located above the first conductive layer 215c, corresponding at least to the bending area BA.

When a stack structure is bent, there is a stress neutral plane in the stack structure. If there is no BPL 600, when the substrate 100 is bent, excessive tensile stress may be applied to the first conductive layer 215c in the bending area BA, because the location of the first conductive layer 215c may not correspond to a stress neutral plane. However, by forming the BPL 600 and adjusting a thickness and a modulus of the BPL 600, a location of the stress neutral plane in the structure including the substrate 100, the first conductive layer 215c, and the BPL 600 may be adjusted. Therefore, the stress neutral plane may be adjusted to be around the first conductive layer 215c via the BPL 600, and thus, the tensile stress applied to the first conductive layer 215c may be reduced or a compressive stress may be applied to the first conductive layer 215c. The BPL 600 may include acryl. When compressive stress is applied to the first conductive layer 215c, the possibility of damaging the first conductive layer 215c is much less than when tensile stress is applied to the first conductive layer 215c.

Figure 4:
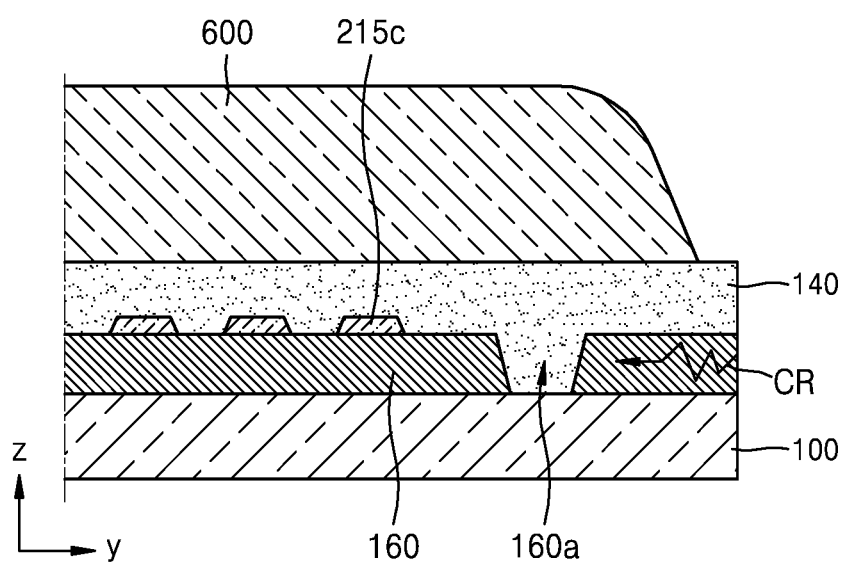
FIG. 4 is a schematic cross-sectional view taken along a line IV-IV of FIG. 3.

In FIG. 4, an end surface of the BPL 600 facing an edge of the substrate 100 (+y direction) does not coincide with an end surface of the substrate 100, but is located on a top surface of the substrate 100. However, one or more embodiments are not limited thereto, that is, the end surface of the BPL 600 may correspond to the end surface of the substrate 100 (see FIG. 15). Otherwise, unlike the example shown in FIG. 4, an additional BPL that is spaced apart from the BPL 600 to be located closer to the edge of the substrate 100 (+y direction) may be provided. This may be understood that the BPL 600 has an opening that penetrates through the BPL in an up-and-down direction, similarly to the second opening 160a of the organic material layer 160 which will be described later.

In particular, when a plurality of display units are formed on a mother substrate and then the mother substrate is cut to simultaneously manufacture a plurality of display apparatuses, the BPL 600 may be formed before the cutting process. In this case, the BPL is also cut when the mother substrate is cut, and accordingly, the end surface of the BPL 600 may correspond to the end surface of the substrate 100. The cutting may be performed by irradiating a laser beam to the mother substrate.

In addition, in FIG. 2, an upper surface of the BPL 600 in a direction towards the display area DA (-x direction) corresponds to an upper surface of the polarization plate 520 (in the +z direction), but is not limited thereto. For example, an end of the BPL 600 in the direction towards the display area DA (-x direction) may partially cover an upper surface at the edge of the polarization plate 520. Otherwise, the end of the BPL 600 in the direction towards the display area DA (-x direction) may not contact the polarization plate 520 and/or the OCA 510. In the latter case, during or after forming the BPL 600, movement of gas generated from the BPL 600 in a direction toward the display area DA (-x direction), which risks degrading the display device 300, may be prevented.

As shown in FIG. 2, if the upper surface of the BPL 600 in a direction towards the display area DA (-x direction) coincides with the upper surface of the polarization plate 520 in the +z direction, if the end of the BPL 600 in the display area DA direction (-x direction) partially covers the upper surface at the end of the polarization plate 520, or if the end of the BPL 600 in the display area DA direction (-x direction) contacts the OCA 510, a thickness of the BPL 600 corresponding to the display area DA (-x direction) may be greater than that of the other portions in the BPL 600. Since a liquid phase material or a paste-type material may be applied and hardened to form the BPL 600, a volume of the BPL 600 may be reduced through the hardening process. Here, if the portion of the BPL 600 corresponding to the display area DA (-x direction) is in contact with the polarization plate 520 and/or the OCA 510, the portion of the BPL 600 is fixed at the location, and thus, a volume reduction occurs in the remaining portion of the BPL 600. Therefore, the thickness of the BPL 600 corresponding or proximate to the display area DA (-x direction) may be greater than that of the rest of the BPL 600.

In addition, the organic material layer 160 in the display apparatus according to the embodiment includes the second opening 160a extending along an edge of the substrate 100 as shown in FIG. 3. In FIG. 3, the organic material layer 160 includes second openings 160a that extend proximate to the edges of the substrate 100. Since the organic material layer 160 has the second openings 160a, occurrence of defects during manufacturing the display apparatus or using the display apparatus that is manufactured may be reduced.

Although FIG. 3 shows a state in which the substrate 100 is not bent for convenience of description, the display apparatus according to the embodiment is actually bent at the bending area BA, as shown in FIG. 1. Therefore, the bending area BA is located at an edge of the display apparatus. During the manufacturing processes or afterward, shock may be applied to the bending area BA. In particular, shock is more likely to be applied to an edge of the bending area BA in the +y direction or -y direction, and in this case, as shown in FIG. 4 that is a schematic cross-sectional view taken along a line IV-IV of FIG. 3, crack CR may occur in the organic material layer 160 due to external shock. If such a crack CR reaches a center portion of the bending area BA, cracks may also occur in wires such as the first conductive layer 215c, generating defects in the display apparatus.

However, according to the display apparatus of the embodiment, the organic material layer 160 includes the second openings 160a as described above. The second openings 160a extend along the edges of the substrate 100 (in the +x direction when viewed as if the substrate 100 is not bent). Therefore, even if the crack CR occurs at the edge of the organic material layer 160 as shown in FIG. 4, the crack CR may not reach the center portion of the bending area BA, but may be stopped by the second openings 160a. As such, even if shock is applied to an outer portion of the bending area BA during manufacturing processes or afterward, generation of defects due to cracks in the display apparatus may be prevented or reduced.

In order to promote defect prevention or reduction effects throughout the entire bending area BA, a length d of the second opening 160a in its lengthwise direction (see FIG. 3) may be greater than the width BAw of the bending area BA from the first area 1A to the second area 2A. As such, occurrence of cracks in the entire bending area BA due to shock applied to the edge of the substrate 100 may be prevented or reduced.

Figure 5:
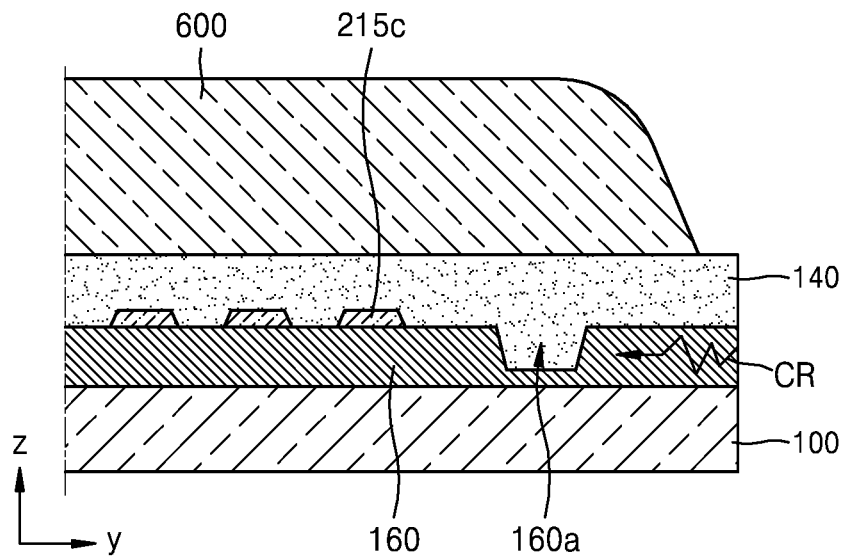
FIG. 5 is a schematic cross-sectional view of a part of a display apparatus according to an embodiment.

In addition, the second openings 160a of the organic material layer 160 may not necessarily penetrate through the organic material layer 160 as above. For example, as shown in FIG. 5 that is a schematic cross-sectional view of a part of a display apparatus according to an embodiment, the organic material layer 160 may include a second feature that is a second groove 160a, rather than the second opening 160a. In this case, propagation of cracks CR generated in the organic material layer 160 towards the center portion of the bending area BA may be effectively prevented by the second groove 160a. The above and other descriptions of the second opening 160a may be applied to the second groove 160a.

Figure 6:
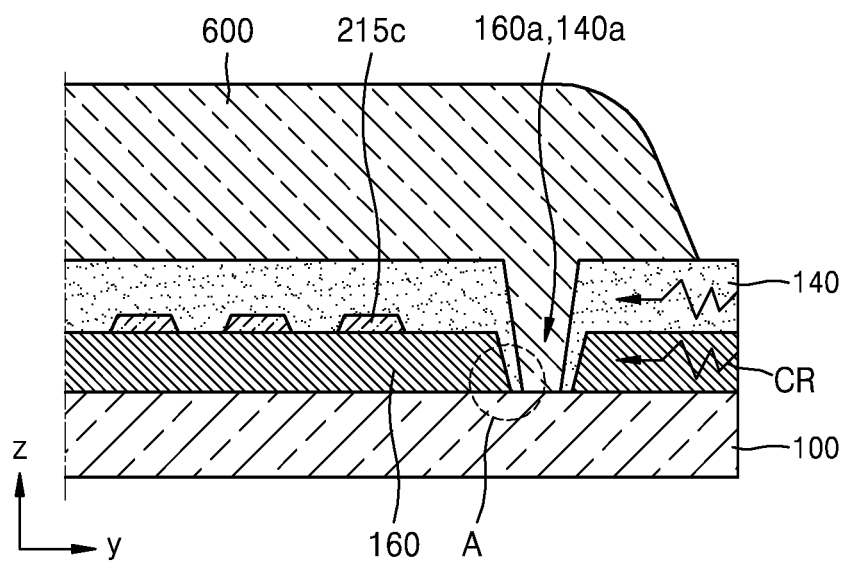
FIG. 6 is a schematic cross-sectional view of a part of a display apparatus according to an embodiment.

Moreover, as shown in FIG. 6 that is a schematic cross-sectional view of a part of a display apparatus according to an embodiment, in addition to the organic material layer 160 including the second opening 160*a*, the planarization layer 140 above the organic material layer 160 may also include a third feature that is a third opening 140*a* corresponding to the second opening 160*a*. The third opening 140*a* of the planarization layer 140 may extend an edge of the substrate 100 like the second opening 160*a* of the organic material layer 160. That is, similar to the second opening 160*a* shown in FIG. 3, the planarization layer 140 may have third openings 140*a* extending along the edges of the substrate 100.

The third openings 140*a* extend along the edge of the substrate 100 (in the +x direction when viewed as if the substrate 100 is not bent). Therefore, as shown in FIG. 6, even if crack CR occurs at the edge of the organic material layer 160 and/or the planarization layer 140, the crack CR may not reach the center portion of the bending area BA, but may be stopped around the second opening 160*a* and the third opening 140*a*. As such, even if shock is applied to the outer portion of the bending area BA during manufacturing processes or utilizing processes after manufacturing, defects caused by cracks in the display apparatus may be prevented or reduced.

In order to promote defect prevention or reduction effects throughout the entire bending area BA, a length of the third opening 140*a* of the planarization layer 140 may be greater than the width BAw of the bending area BA from the first area 1A to the second area 2A. As such, occurrence of cracks in the entire bending area BA due to shock applied to the edge of the substrate 100 may be prevented or reduced.

The planarization layer 140 may not necessarily have the third opening 140*a* penetrating through the planarization layer 140 as above. That is, the planarization layer 140 may include a third feature that is a third groove, not the third opening 140*a*. This is also applied to the above-described embodiments, embodiments that will be described later, or modified examples thereof. In addition, the embodiment may be variously modified, for example, the organic material layer 160 may not include the second opening 160*a* or the second groove 160*a* and the planarization layer 14 may only include the third opening 140*a* or the third groove 140*a*. This is also applied to the above-described embodiments, embodiments that will be described later, or modified examples thereof.

As described above, when the organic material layer 160 has the second opening 160*a* and the planarization layer 140 has the third opening 140*a*, the BPL 600 may at least partially fill the second opening 160*a* or at least partially fill the third opening 140*a*. The BPL 600 may not only fill the second opening 160*a* or the third opening 140*a* at least partially, but may also cover the bending area BA.

As described above, the BPL 600 adjusts the location of a stress neutral plane. If the BPL 600 does not fill the second opening 160*a* or the third opening 140*a*, the stress neutral plane is located at an intermediate portion between the upper and lower surfaces of the substrate 100 under the second opening 160*a* or the third opening 140*a*, and peripheral portions thereof. Accordingly, when the substrate 100 is bent, compressive stress is applied to a part, e.g., from a center portion toward the lower surface, of the substrate 100, but tensile stress is applied to a part, e.g., from the center portion toward the upper surface, of the substrate 100. Accordingly, cracks or tears may occur between the center portion and the upper surface of the substrate 100. However, the BPL 600 fills at least partially the second opening 160*a* or the third opening 140*a* so as to adjust the location of the stress neutral plane, and thus, occurrence of defects in the substrate 100 may be prevented or reduced. Even if a crack CR occurs in the organic material layer 160 and/or the planarization layer 140, the second opening 160*a* or the third opening 140*a* may prevent or reduce propagation of the crack CR toward the center portion of the bending area BA.

In addition, as shown in FIG. 6, the planarization layer 140 may cover an internal side surface of the second opening 160*a* in the organic material layer 160. As described above, the first conductive layer 215*c* may be simultaneously formed with the source electrode 215*a* and the drain electrode 215*b* by using the same material as that of the source and drain electrodes 215*a* and 215*b*. To accomplish this, a conductive layer is formed above the organic material layer 160 and/or the interlayer insulating layer 130 throughout almost the entire surface of the substrate 100, and is then patterned to form the source electrode 215*a*, the drain electrode 215*b*, and the first conductive layer 215*c*. Therefore, as shown in FIG. 7 that is an enlarged cross-sectional view of a part A of FIG. 6, a conductive material may remain on the internal side surface of the second opening 160*a* in the organic material layer 160, and thus, a conductive remaining layer 215*c'* may remain at least partially along the internal side surface of the second opening 160*a*.

The conductive remaining layer 215*c'* may cause shorts between two different conductive layers, or cause defects. For example, when the pixel electrode 310 (see FIG. 2) is formed, a material for forming the pixel electrode 310 may agglomerate around the conductive remaining layer 215*c'*. This is because, if the conductive remaining layer 215*c'* includes aluminum and the pixel electrode 310 includes silver (Ag), this silver may react with aluminum to form a lump around the conductive remaining layer 215*c'*.

Figure 7:
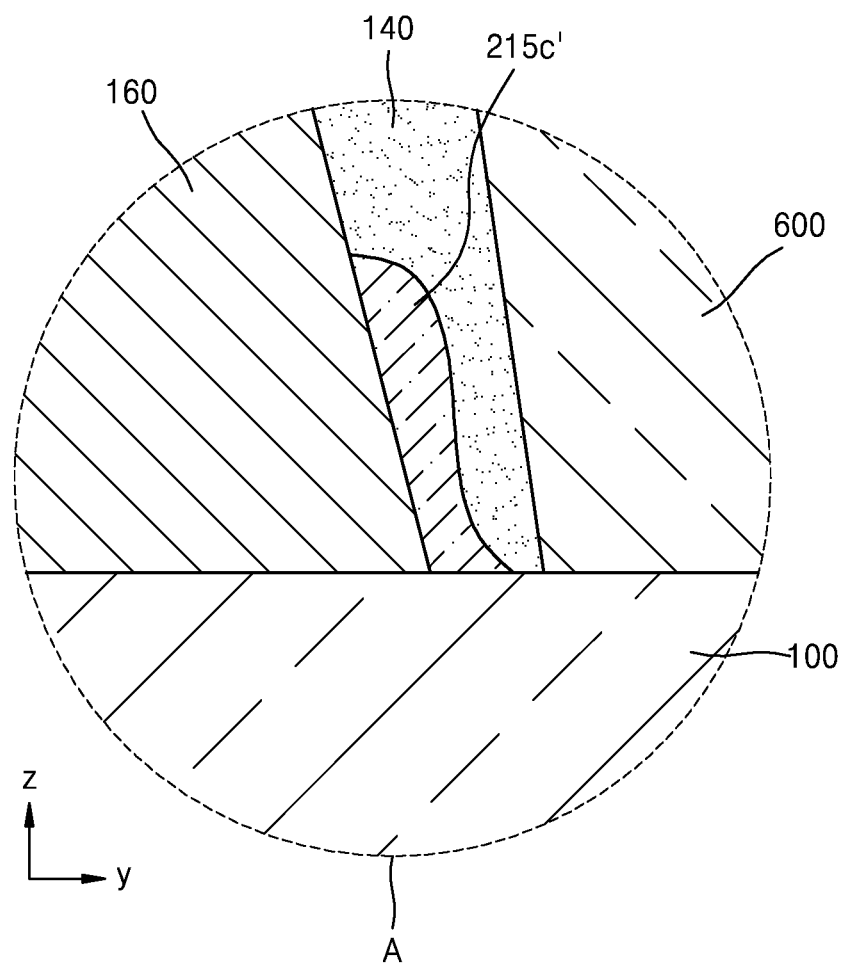
FIG. 7 is an enlarged cross-sectional view of a part A of FIG. 6.

Therefore, as shown in FIG. 7, since the planarization layer 140 covers the internal side surface of the second opening 160*a* in the organic material layer 160 so as to cover the conductive remaining layer 215*c'*, the conductive remaining layer 215*c'* may not be exposed. As such, occurrence of defects during manufacturing processes may be prevented or reduced. Since the conductive remaining layer 215*c'* may be generated when the first conductive layer 215*c* is formed as described above, the conductive remaining layer 215*c'* may include at least some of the materials included in the first conductive layer 215*c*. As described above, the first conductive layer 215*c* may include titanium or aluminum, and if desired, may have a multi-layered structure including titanium layer/aluminum layer/titanium layer. Therefore, the conductive remaining layer 215*c'* may also include titanium, aluminum, or a mixture or a compound thereof.

Figure 8:
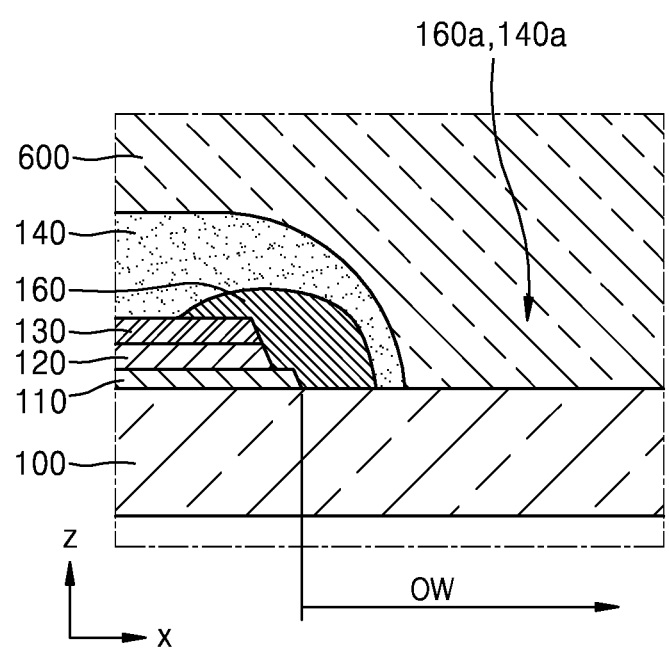
FIG. 8 is a schematic cross-sectional view taken along a line VIII-VIII of FIG. 3.

FIG. 8 is a schematic cross-sectional view taken along a line VIII-VIII of FIG. 3. As shown in FIG. 8, the length d (see FIG. 3) of the second opening 160*a* in the organic material layer 160 may be greater than the length of the third opening 140*a* in the planarization layer 140. Thus, as described above with reference to FIG. 7, the planarization layer 140 may cover the conductive material that may remain on the internal side surface of the second opening 160*a*.

Figure 9:
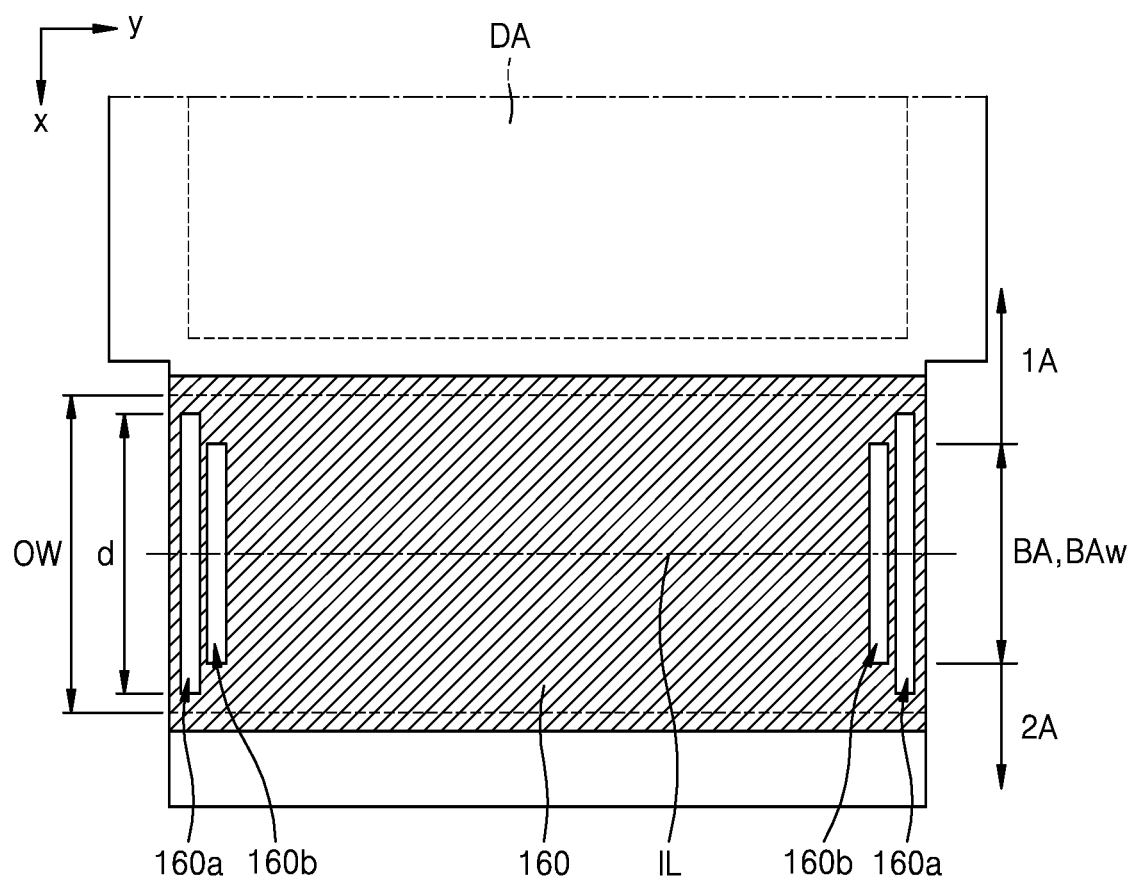
FIG. 9 is a schematic plan view of a part of a display apparatus according to an embodiment.

In the above description, a case where the organic material layer 160 includes the second opening 160*a* is described, but one or more embodiments are not limited thereto. As shown in FIG. 9 that is a schematic plan view of a part of a display apparatus according to an embodiment, the organic material layer 160 may include an additional opening 160*b* or an additional groove. The additional opening 160*b* or the additional groove may extend along the edge of the substrate 100 adjacent to the second opening 160*a*. As described above, since the organic material layer 160 includes the additional opening 160*b* or the additional groove in addition to the second opening 160*a*, propagation of the crack CR (see FIGS. 4 to 6) towards the center portion of the bending area BA may be blocked twice.

In addition, although FIG. 9 shows a state in which the substrate 100 is not bent for convenience of description, the display apparatus according to the embodiment is actually bent at the bending area BA, as shown in FIG. 1. Therefore, unlike that shown in FIG. 9, the bending area BA is located at the edge of the display apparatus, and in particular, a virtual line IL that is in parallel with the bending axis BAX (see FIG. 1) and crosses a center of the bending area BA, is located at the edge of the display apparatus. Therefore, external shock may be applied to the portion of the bending area BA on which the virtual line IL is located. Accordingly, the additional opening 160*b* or the additional groove of the organic material layer 160 is located to cross the virtual line IL, so as to doubly prevent crack CR from proceeding towards the center portion of the bending area BA. That is, although a length of the additional opening 160*b* or the additional groove may be less than that of the second opening 160*a*, the additional opening 160*b* or the additional groove may still cross the virtual line IL.

Figure 10:
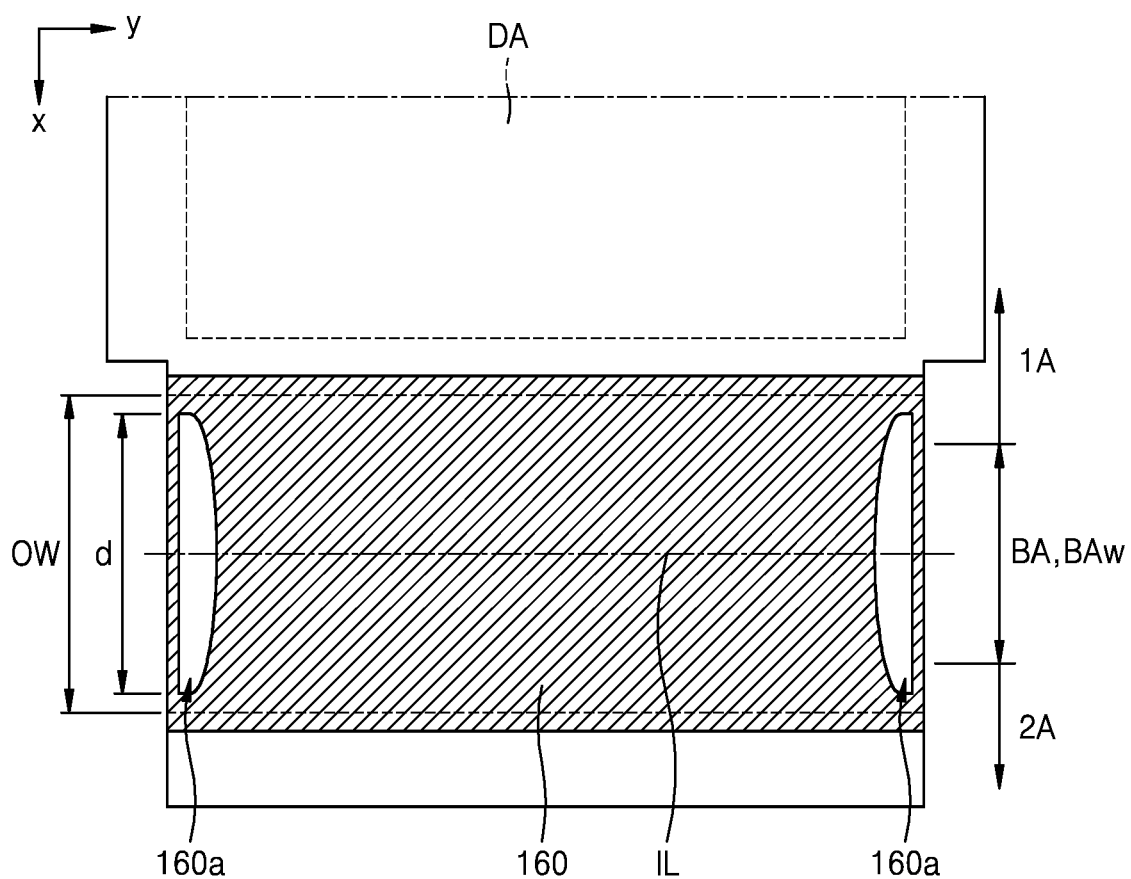
FIG. 10 is a schematic plan view of a part of a display apparatus according to an embodiment.
Figure 11:
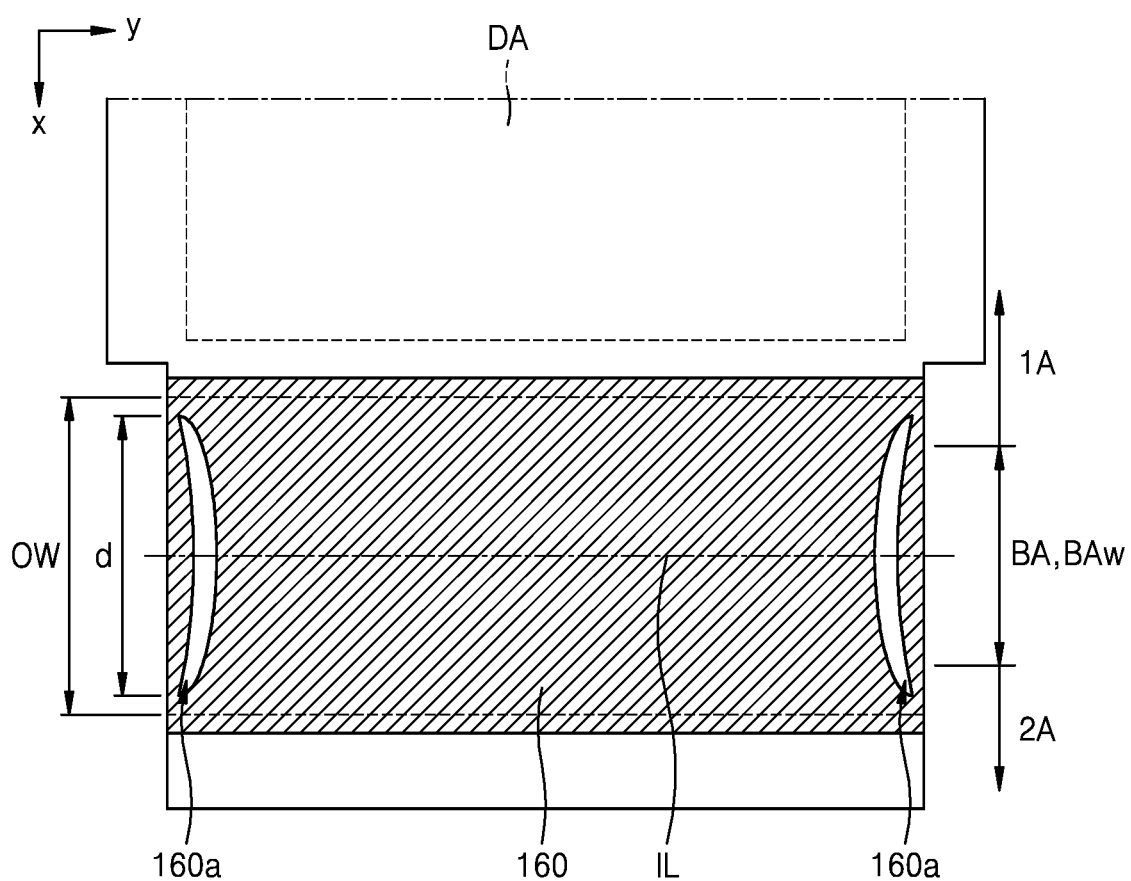
FIG. 11 is a schematic plan view of a part of a display apparatus according to an embodiment.

Otherwise, in order to achieve similar effects to the above, as shown in FIG. 10 that is a schematic plan view of a part of a display apparatus according to an embodiment, the second opening 160*a* in the organic material layer 160 may have a variable width. That is, the second opening 160*a* may have a greater width at a portion crossing the virtual line IL that is parallel with the bending axis BAX (see FIG. 1) and crossing the center of the bending area BA, than that of at least one other portion. The greater the width of the second opening 160*a* is, the less the possibility of propagating the crack CR at that location. Also, as shown in FIG. 11 that is a schematic plan view of a part of a display apparatus according to an embodiment, the second opening 160*a* extends along the edge of the substrate 100, but an intermediate portion of the second opening 160*a* in a length direction thereof is curved towards the center of the bending area BA so that the second opening 160*a* may have a meniscus shape.

Figure 12:
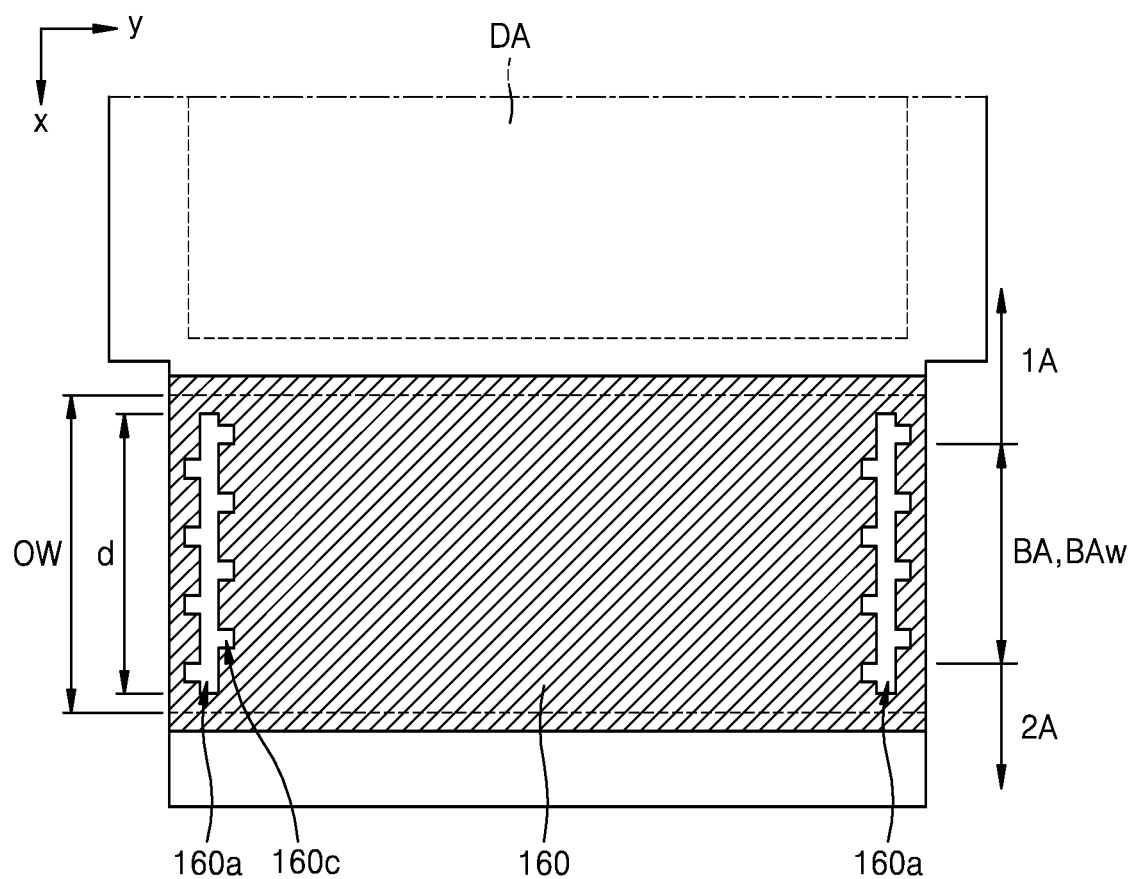
FIG. 12 is a schematic plan view of a part of a display apparatus according to an embodiment.

As shown in FIG. 12 that is a schematic plan view of a part of a display apparatus according to an embodiment, the organic material layer 160 may further include an auxiliary opening 160*c* or an auxiliary groove. The auxiliary opening 160*c* or the auxiliary groove may be connected to the second opening 160*a* and may extend in a direction crossing the lengthwise direction of the second opening 160*a*. The organic material layer 160 may have a plurality of auxiliary openings 160*c* or a plurality of auxiliary grooves, and in this case, the auxiliary openings 160*c* or the auxiliary grooves may be located alternately at opposite sides of the second opening 160*a* in the direction in which the second opening 160*a* extends.

Figure 13:
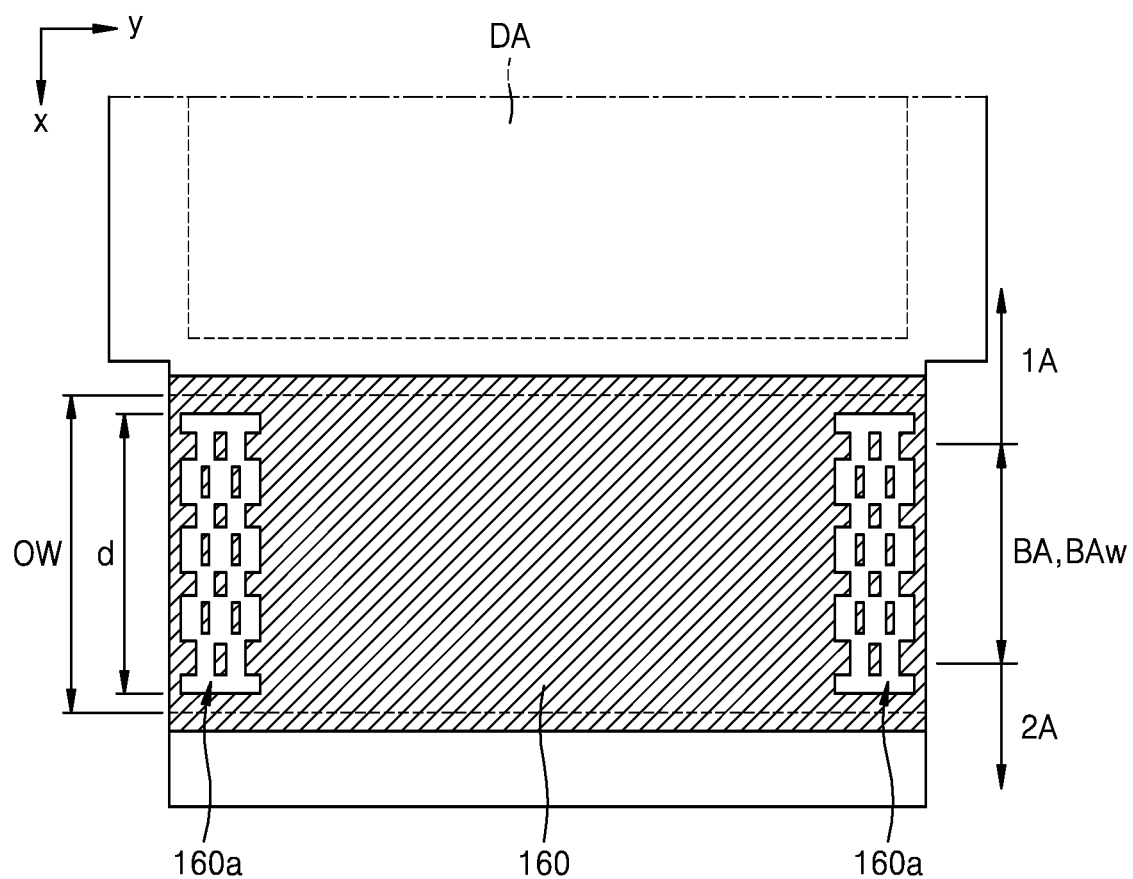
FIG. 13 is a schematic plan view of a part of a display apparatus according to an embodiment.

Also, as shown in FIG. 13 that is a schematic plan view of a part of a display apparatus according to an embodiment, the second opening 160*a* of the organic material layer 160 extends along the edge of the substrate 100, and a plurality of islands of the organic material layer 160 may be located therein.

In addition, it is described above that the second opening or the second groove extends along the edge of the substrate 100, but one or more embodiments are not limited thereto. In addition, the second opening or the second groove may not be formed in the organic material layer 160, but may be formed in another portion. That is, when the substrate 100 including the bending area BA between the first area 1A and the second area 2A is bent about the bending axis BAX and the first conductive layer 215*c* extends from the first area 1A to the second area 2A through the bending area BA, the insulating layer disposed between the substrate 100 and the first conductive layer 215*c* may have a first opening or a first groove that extends in a direction crossing the bending axis BAX to correspond to a portion between the edge of the substrate 100 and the first conductive layer 215*c* at the bending area BA. Here, if the display apparatus includes a plurality of first conductive layers 215*c*, the portion between the edge of the substrate 100 and the first conductive layer 215*c* may be understood as a portion between the edge of the substrate 100 and a first conductive layer among the plurality of first conductive layers 215*c* which is closest to the edge of the substrate 100.

Figure 14:
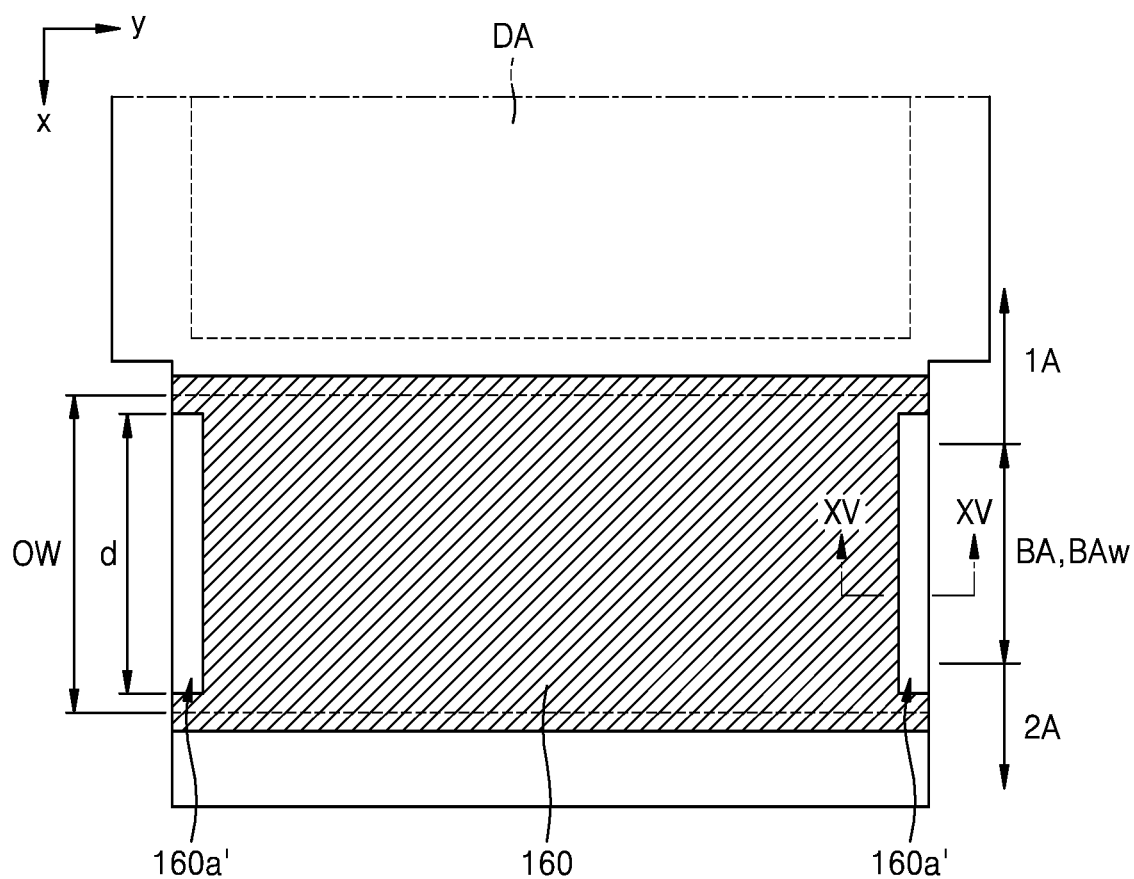
FIG. 14 is a schematic plan view of a part of a display apparatus according to an embodiment.
Figure 15:
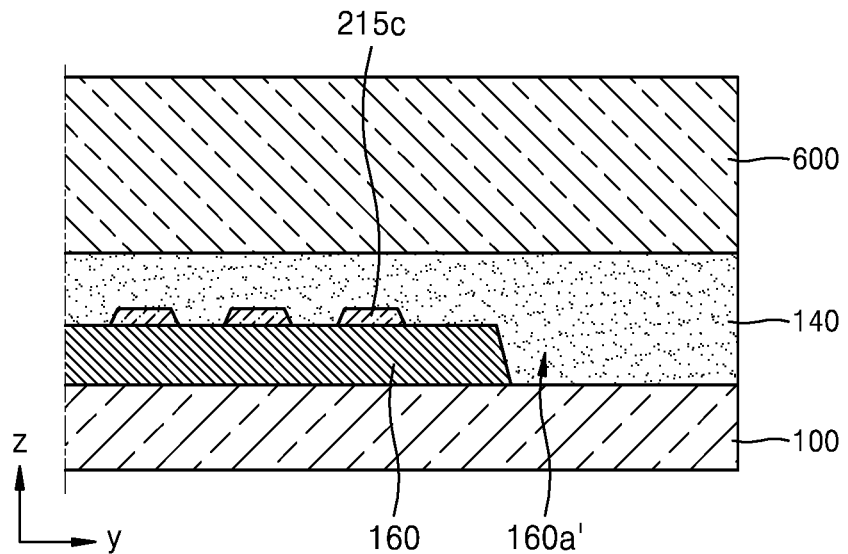
FIG. 15 is a schematic cross-sectional view taken along a line XV-XV of FIG. 14.

FIG. 14 is a schematic plan view of a part of a display apparatus according to an embodiment, and FIG. 15 is a schematic cross-sectional view taken along a line XV-XV of FIG. 14. The display apparatus according to the embodiment is different from the display apparatus according to the previous embodiment illustrated with reference to FIG. 3 in view of a shape of a second opening 160*a*' in the organic material layer 160. As shown in FIGS. 14 and 15, the second opening 160*a*' of the organic material layer 160 may extend to the end of the substrate 100 (in the +y direction or −y direction).

In this case, the planarization layer 140, that is, an additional organic material layer, may extend to the edge of the substrate 100 so as to fill the extended second opening 160*a*' of the organic material layer 160. In particular, as shown in FIG. 15, a side end surface of the planarization layer 140 and a side end surface of the BPL 600 roughly correspond to a side end surface of the substrate 100, and thus, the edge of the substrate 100 may be sufficiently supported by the planarization layer 140 and/or the BPL 600 even when the organic material layer 160 includes the second opening 160*a*'. As such, even if the substrate 100 that is flexible or bendable is very small in thickness, unintentional deformation of the substrate 100 may be effectively prevented.

Figure 16:
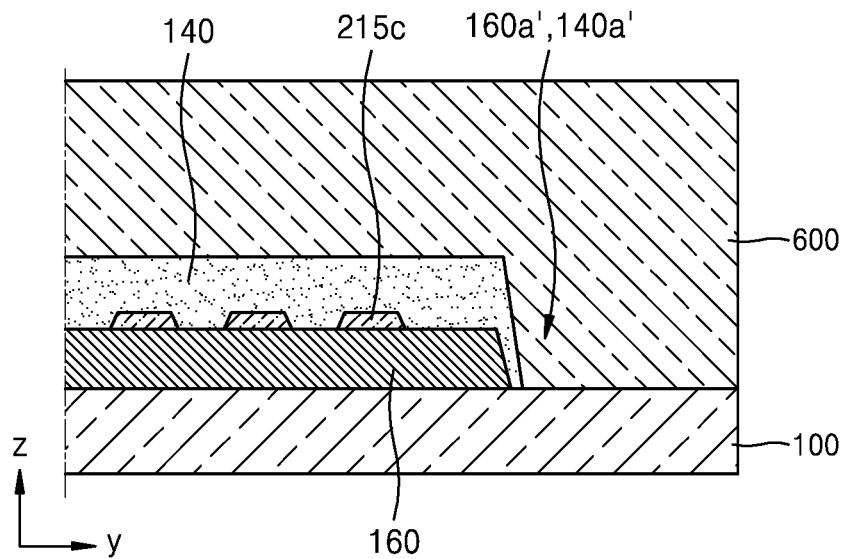
FIG. 16 is a schematic cross-sectional view of a part of a display apparatus according to an embodiment.

In addition, as shown in FIG. 16 that is a schematic cross-sectional view of a part of a display apparatus according to an embodiment, similar to the organic material layer 160, a third opening 140*a*' of the planarization layer 140 may extend to the end of the substrate 100 (in the +y direction or −y direction). In this case, the side end surface of the BPL 600 roughly corresponds to the side end surface of the substrate 100, and thus, the BPL 600 may sufficiently support the edge of the substrate 100 even when the organic material layer 160 includes the extended second opening 160*a*' and the planarization layer 140 includes the extended third opening 140*a*'. As such, even if the substrate 100 that is flexible or bendable is very small in thickness, unintentional deformation of the substrate 100 may be effectively prevented.

Figure 17:
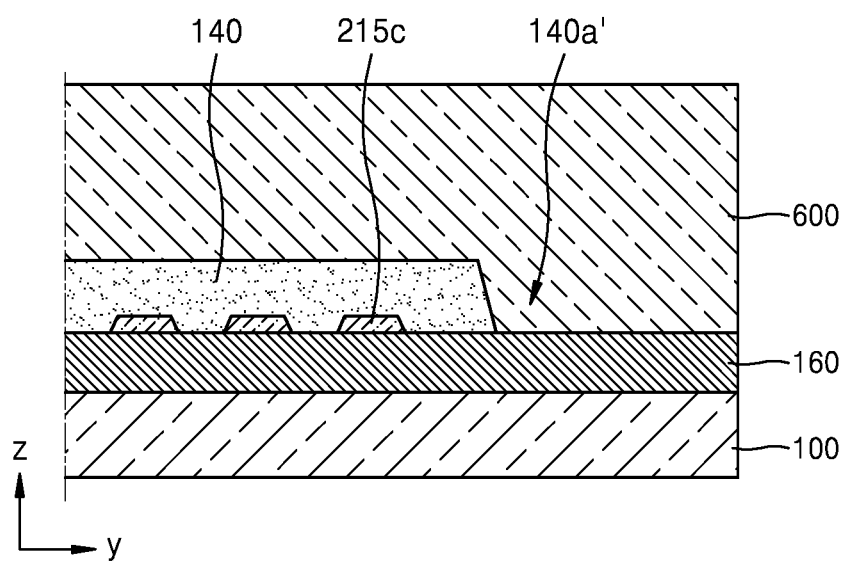
FIG. 17 is a schematic cross-sectional view of a part of a display apparatus according to an embodiment.

As shown in FIG. 17 that is a schematic cross-sectional view of a part of a display apparatus according to an embodiment, the organic material layer 160 may extend to the edge of the substrate 100 and the planarization layer 140 has a third opening 140*a*' that may extend to the end of the substrate 100 (in the +y direction or −y direction). In this case, the side end surface of the BPL 600 may roughly correspond to the side end surface of the substrate 100.

In FIGS. 15 to 17, the organic material layer 160 includes the second opening 160a' extending to the edge of the substrate 100 or the planarization layer 140 includes the third opening 140a' extending to the edge of the substrate 100, but one or more embodiments are not limited thereto. For example, the organic material layer 160 may include a second groove extending to the edge of the substrate 100, and the planarization layer 140 may include a third groove extending to the edge of the substrate 100.

According to one or more embodiments, the display apparatus capable of reducing generation of defects during or after manufacturing may be implemented. However, the scope of the inventive concept is not limited to the above effects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims. Various features of the above described and other embodiments can be mixed and matched in any manner, to produce further embodiments consistent with the invention.

What is claimed is:

1. A display apparatus comprising:
 a substrate comprising a bending portion bent about a bending axis;
 a first conductive layer and a second conductive layer on the bending portion of the substrate; and
 a first organic material layer on the first conductive layer and the second conductive layer,
 wherein a first portion of the first organic material layer directly contacts the first conductive layer,
 wherein a second portion of the first organic material layer is between the first conductive layer and the second conductive layer,
 wherein a thickness of the first portion of the first organic material layer is smaller than a thickness of the second portion of the first organic material layer.

2. The display apparatus of claim 1, further comprising a second organic material layer overlapping the bending portion and disposed between the substrate and the first organic material layer.

3. The display apparatus of claim 2, wherein the second organic material includes a third portion overlapping the first portion of the first organic material and a fourth portion overlapping the second portion of the first organic material,
 a thickness of the first portion of the first organic material layer and the third portion of the second organic material layer is smaller than a thickness of the second portion of the first organic material layer and the fourth portion of the second organic material layer.

4. The display apparatus of claim 1, further comprising an insulating layer overlapping the bending portion, disposed between the substrate and the first conductive layer, and directly contacting the first conductive layer.

5. The display apparatus of claim 4, wherein a thickness of the insulating layer overlapping the first portion of the first organic material is greater than a thickness of a part of the insulating layer.

6. The display apparatus of claim 4, wherein the insulating layer includes an opening or a groove corresponding to the bending portion.

7. The display apparatus of claim 6, wherein the first organic material layer fills the opening or the groove of the insulating layer.

8. The display apparatus of claim 1, further comprising:
 a thin film transistor overlapping a display portion positioned on a side of the bending portion; and
 a display element including a pixel electrode electrically connected to the thin film transistor,
 wherein a portion of the first organic material layer is disposed between the thin film transistor and the pixel electrode and overlaps the display portion.

9. The display apparatus of claim 8, wherein a material of the first conductive layer is identical to a material of a source electrode or a drain electrode of the thin film transistor.

10. The display apparatus of claim 1, wherein the substrate is flexible.

11. The display apparatus of claim 1, wherein the substrate comprises polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

12. The display apparatus of claim 1, wherein the substrate has a multi-layered structure including two organic layers and an inorganic layer between the two organic layers.

13. A display apparatus comprising:
 a substrate;
 a semiconductor layer on the substrate layer;
 a gate insulating layer having a first opening or groove on the semiconductor layer;
 a first conductive layer on the gate insulating layer, wherein the first conductive layer comprises a gate electrode;
 an insulating layer having a second opening or groove on the first conductive layer, wherein the first opening—or groove overlaps with the second opening or groove;
 a second conductive layer on the insulating layer, wherein the second conductive layer comprises a drain electrode;
 a third conductive layer crossing the first opening or groove and the second opening or groove;
 a first organic material layer having a third opening, wherein the first organic material layer directly contacts the third conductive layer and the substrate;
 an organic light-emitting device including a pixel electrode, wherein the organic light-emitting device is electrically connected to the drain electrode through the third opening;
 a first encapsulation layer covering the organic light-emitting device, wherein the first encapsulation layer is made of an organic material; and
 a protection layer covering the first opening or groove and the second opening or groove.

14. The display apparatus of claim 13, wherein the substrate is flexible.

15. The display apparatus of claim 14, wherein the substrate is bent at a portion which the first opening and the second opening are positioned.

16. The display apparatus of claim 15, wherein the second conductive layer and the third conductive layer are made of a same material.

17. The display apparatus of claim 16, wherein the protection layer is disposed above the third conductive layer.

18. The display apparatus of claim 17, further comprising:
a second encapsulation layer made of an inorganic material, wherein the second encapsulation layer is on the first encapsulation layer or under the first encapsulation layer.

19. The display apparatus of claim 18, wherein the substrate has a multi-layered structure including two organic layers and an inorganic layer between the two organic layers.

20. The display apparatus of claim 18, wherein the substrate comprises polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

21. The display apparatus of claim 18, further comprising:
a polarization plate attached on the first encapsulation layer or the second encapsulation layer.

22. The display apparatus of claim 18, further comprising:
a buffer layer disposed on the substrate and under the semiconductor layer, wherein the first buffer layer has a fourth opening or groove at the first opening or groove.

23. The display apparatus of claim 22, wherein the buffer layer includes a silicon oxide material.

24. The display apparatus of claim 23, wherein a width of the fourth opening or groove is wider than a width of the first opening or groove along an edge of the substrate to cross a bending axis which the substrate is bent about.

25. The display apparatus of claim 24, wherein the substrate has a multi-layered structure including two organic layers and an inorganic layer between the two organic layers.

26. The display apparatus of claim 24, wherein the substrate comprises polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

27. The display apparatus of claim 24, further comprising:
a polarization plate attached on the first encapsulation layer or the second encapsulation layer.

28. The display apparatus of claim 18, further comprising:
a second organic material layer disposed on the substrate and under the third conductive layer.

29. The display apparatus of claim 28, wherein the second organic material layer comprises a fourth opening, and wherein the first organic material layer directly contacts the substrate through the fourth opening.

30. The display apparatus of claim 29, further comprising:
a buffer layer disposed on the substrate and under the semiconductor layer, wherein the first buffer layer having a fifth opening or groove at the first opening or groove.

31. The display apparatus of claim 30, wherein the buffer layer includes a silicon oxide material.

32. The display apparatus of claim 31, wherein the substrate has a multi-layered structure including two organic layers and an inorganic layer between the two organic layers.

33. The display apparatus of claim 31, wherein the substrate comprises polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

34. The display apparatus of claim 31, further comprising:
a polarization plate attached on the first encapsulation layer or the second encapsulation layer.

35. A display apparatus comprising:
a substrate;
a semiconductor layer on the substrate layer;
a gate insulating layer having a first opening or groove on the semiconductor layer;
a first conductive layer on the gate insulating layer, wherein the first conductive layer comprises a gate electrode;
an insulating layer having a second opening or groove on the first conductive layer, wherein the first opening or groove overlaps with the second opening or groove;
a second conductive layer on the insulating layer, wherein the second conductive layer comprises a drain electrode;
a third conductive layer crossing the first opening or groove and the second opening or groove;
a first organic material layer having a third opening, wherein the first organic material layer directly contacts the third conductive layer and the substrate;
an organic light-emitting device including a pixel electrode, wherein the organic light-emitting device is electrically connected to the drain electrode through the third opening;
a first encapsulation layer covering the organic light-emitting device, wherein the first encapsulation layer is made of an organic material; and
a protection layer covering the first opening or groove and the second opening or groove.

36. The display apparatus of claim 35, wherein the substrate is flexible.

37. The display apparatus of claim 36, wherein the substrate is bent at a portion which the first opening and the second opening are positioned.

38. The display apparatus of claim 37, wherein the second conductive layer and the third conductive layer are made of a same material.

39. The display apparatus of claim 38, wherein the protection layer is disposed above the third conductive layer.

40. The display apparatus of claim 39, further comprising:
a second encapsulation layer made of an inorganic material, wherein the second encapsulation layer is on the first encapsulation layer or under the first encapsulation layer.

41. The display apparatus of claim 40, wherein the substrate has a multi-layered structure including two organic layers and an inorganic layer between the two organic layers.

42. The display apparatus of claim 40, wherein the substrate comprises polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

43. The display apparatus of claim 40, further comprising:
a polarization plate attached on the first encapsulation layer or the second encapsulation layer.

44. The display apparatus of claim 40, further comprising:
a buffer layer disposed on the substrate and under the semiconductor layer, wherein the first buffer layer has a fourth opening or groove at the first opening or groove.

45. The display apparatus of claim 44, wherein the buffer layer includes a silicon oxide material.

46. The display apparatus of claim 45, wherein a width of the fourth opening or groove is wider than a width of the first opening or groove along an edge of the substrate to cross a bending axis which the substrate is bent about.

47. The display apparatus of claim 46, wherein the substrate has a multi-layered structure including two organic layers and an inorganic layer between the two organic layers.

48. The display apparatus of claim 46, wherein the substrate comprises polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

49. The display apparatus of claim 46, further comprising:
a polarization plate attached on the first encapsulation layer or the second encapsulation layer.

50. The display apparatus of claim 40, further comprising:
a second organic material layer disposed on the substrate and under the third conductive layer.

51. The display apparatus of claim 50, wherein the second organic material layer fills the first opening or groove and the second opening or groove.

52. The display apparatus of claim 51, further comprising:
first buffer layer having a fourth opening at the first opening.

53. The display apparatus of claim 52, wherein the buffer layer includes a silicon oxide material.

54. The display apparatus of claim 53, wherein the substrate has a multi-layered structure including two organic layers and an inorganic layer between the two organic layers.

55. The display apparatus of claim 53, wherein the substrate comprises polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

56. The display apparatus of claim 53, further comprising:
a polarization plate attached on the first encapsulation layer or the second encapsulation layer.

57. The display apparatus of claim 50, wherein the second organic material layer comprises a fourth opening, and wherein the first organic material layer directly contacts the substrate through the fourth opening.

58. The display apparatus of claim 57, further comprising:
first buffer layer having a fifth opening or groove at the first opening or groove.

59. The display apparatus of claim 58, wherein the buffer layer includes a silicon oxide material.

60. The display apparatus of claim 59, wherein the substrate has a multi-layered structure including two organic layers and an inorganic layer between the two organic layers.

61. The display apparatus of claim 59, wherein the substrate comprises polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

62. The display apparatus of claim 61, further comprising:
a polarization plate attached on the first encapsulation layer or the second encapsulation layer.

63. A display apparatus comprising:
a substrate;
a semiconductor layer on the substrate layer;
a gate insulating layer having a first opening or groove on the semiconductor layer;
a first conductive layer on the gate insulating layer, wherein the first conductive layer comprises a gate electrode;
an insulating layer having a second opening or groove on the first conductive layer, wherein the first opening—or groove overlaps with the second opening or groove;
a second conductive layer on the insulating layer,
wherein the second conductive layer comprises a drain electrode;
a first organic material layer disposed on the substrate in the first opening or groove and the second opening or groove;
a third conductive layer crossing the first opening or groove and the second opening or groove;
a second organic material layer having a third opening,
wherein the second organic material layer directly contacts the third conductive layer and the first organic material layer;
an organic light-emitting device including a pixel electrode,
wherein the organic light-emitting device is electrically connected to the drain electrode through the third opening;
a first encapsulation layer covering the organic light-emitting device,
wherein the first encapsulation layer is made of an organic material; and
a protection layer covering the first opening or groove and the second opening or groove.

64. The display apparatus of claim 63, wherein the substrate is flexible.

65. The display apparatus of claim 64, wherein the substrate is bent at a portion which the first opening and the second opening are positioned.

66. The display apparatus of claim 65, wherein the second conductive layer and the third conductive layer are made of a same material.

67. The display apparatus of claim 66, wherein the protection layer is disposed above the third conductive layer.

68. The display apparatus of claim 67, further comprising:
a second encapsulation layer made of an inorganic material,
wherein the second encapsulation layer is on the first encapsulation layer or under the first encapsulation layer.

69. The display apparatus of claim 68, wherein the substrate has a multi-layered structure including two organic layers and an inorganic layer between the two organic layers.

70. The display apparatus of claim 68, wherein the substrate comprises polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

71. The display apparatus of claim 68, further comprising:
a polarization plate attached on the first encapsulation layer or the second encapsulation layer.

72. The display apparatus of claim 68, further comprising:
first buffer layer having a fourth opening at the first opening.

73. The display apparatus of claim 72, wherein the buffer layer includes a silicon oxide material.

74. The display apparatus of claim 73, wherein the substrate has a multi-layered structure including two organic layers and an inorganic layer between the two organic layers.

75. The display apparatus of claim 74, wherein the substrate comprises polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

76. The display apparatus of claim 75, further comprising:
a polarization plate attached on the first encapsulation layer or the second encapsulation layer.

77. The display apparatus of claim 68, wherein the first organic material layer comprises a fourth opening, and wherein the first organic material layer directly contacts the substrate through the fourth opening.

78. The display apparatus of claim 77, further comprising:
buffer layer having a fifth opening or groove at the first opening or groove.

79. The display apparatus of claim 78, wherein the buffer layer includes a silicon oxide material.

80. The display apparatus of claim 79, wherein the substrate has a multi-layered structure including two organic layers and an inorganic layer between the two organic layers.

81. The display apparatus of claim 80, wherein the substrate comprises polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

82. The display apparatus of claim 81, further comprising:
a polarization plate attached on the first encapsulation layer or the second encapsulation layer.

* * * * *